(12) United States Patent
Li et al.

(10) Patent No.: US 10,335,903 B2
(45) Date of Patent: Jul. 2, 2019

(54) CLAMPING DEVICE FOR SOLDERING OPERATIONS

(71) Applicants: HONGFUJIN PRECISION ELECTRONICS (ZHENGZHOU) CO., LTD., Zhengzhou (CN); HON HAI PRECISION INDUSTRY CO., LTD., New Taipei (TW)

(72) Inventors: Xi-Hang Li, Zhengzhou (CN); Bing Liu, Zhengzhou (CN); Wei Wu, Zhengzhou (CN); Qing-Lei Pan, Zhengzhou (CN); Shi-Li Zhang, Zhengzhou (CN); Yuan Gao, Zhengzhou (CN)

(73) Assignees: HONGFUJIN PRECISION ELECTRONICS (ZHENGZHOU) CO., LTD., Zhengzhou (CN); HON HAI PRECISION INDUSTRY CO., LTD., New Taipei (TW)

( * ) Notice: Subject to any disclaimer, the term of this patent is extended or adjusted under 35 U.S.C. 154(b) by 351 days.

(21) Appl. No.: 15/336,826

(22) Filed: Oct. 28, 2016

(65) Prior Publication Data

US 2017/0151640 A1 Jun. 1, 2017

(30) Foreign Application Priority Data

Nov. 30, 2015 (CN) .......................... 2015 1 0857353

(51) Int. Cl.
*B23K 1/00* (2006.01)
*H05K 3/34* (2006.01)
*B23K 37/04* (2006.01)
*B23K 101/42* (2006.01)

(52) U.S. Cl.
CPC ........ *B23K 37/0443* (2013.01); *B23K 1/0016* (2013.01); *H05K 3/3436* (2013.01); *B23K 2101/42* (2018.08); *H05K 2203/0169* (2013.01); *H05K 2203/0195* (2013.01); *H05K 2203/0278* (2013.01); *H05K 2203/1509* (2013.01); *H05K 2203/159* (2013.01); *Y02P 70/613* (2015.11)

(58) Field of Classification Search
CPC ....................... B23K 2101/36–2101/42; B23K 37/0426–37/0443; H05K 13/0069; H05K 13/04; H05K 2201/10393; H05K 3/303; H05K 3/306; H05K 3/34; H05K 3/341
See application file for complete search history.

(56) References Cited

U.S. PATENT DOCUMENTS 3,395,439 A * 8/1968 Palesi .................... H05K 3/306
228/4.1
3,540,718 A * 11/1970 Heffron .................. H05K 3/306
269/254 R (Continued)

*Primary Examiner* — Tyrone V Hall, Jr.
(74) *Attorney, Agent, or Firm* — ScienBiziP, P.C.

(57) ABSTRACT

A clamping device which uses its own weight to apply pressure during a soldering operation to a solderable part or component for attachment to a circuit board is provided. The clamping device includes a base plate and at least one press block which is configured to be arranged on the base plate and is free to move up or down by gravity relative to the base plate. When the gravitational orientation of the clamping device is correct, the press block moves down relative to the base plate and so presses on the solderable part during soldering.

11 Claims, 3 Drawing Sheets

(56) References Cited

U.S. PATENT DOCUMENTS

| | | | | | |
|---|---|---|---|---|---|
| 3,730,511 | A | * | 5/1973 | Caras | B25B 5/10 156/580 |
| 4,655,164 | A | * | 4/1987 | Nelson | H01L 21/67121 118/503 |
| 4,787,550 | A | * | 11/1988 | Masuda | B23K 3/0676 118/503 |
| 4,804,130 | A | * | 2/1989 | Kwan | B23K 3/087 228/44.7 |
| 4,933,808 | A | * | 6/1990 | Horton | H01L 23/5385 165/80.3 |
| 5,263,632 | A | * | 11/1993 | Zadrick | B23K 3/087 228/260 |
| 6,164,636 | A | * | 12/2000 | Taylor | H05K 13/0069 269/287 |
| 6,792,675 | B2 | * | 9/2004 | Tran | H01R 43/0256 269/71 |
| 9,033,328 | B2 | * | 5/2015 | Baumann | B23K 20/126 269/266 |
| 2007/0251981 | A1 | * | 11/2007 | Chapman | B23K 1/0016 228/214 |

* cited by examiner

CLAMPING DEVICE FOR SOLDERING OPERATIONS

CROSS-REFERENCE TO RELATED APPLICATIONS

This application claims priority to Chinese Patent Application No. 201510857353.8 filed on Nov. 30, 2015, the contents of which are incorporated by reference herein.

FIELD

The subject matter herein generally relates to clamping devices, and particularly, to a self-weighted clamping device capable of holding an electronic part for a soldering operation.

BACKGROUND

A clamping device may be employed to press a SIM card onto a circuit board to fix the SIM card in place for soldering it into the circuit board using Surface Mount Technology (SMT).

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
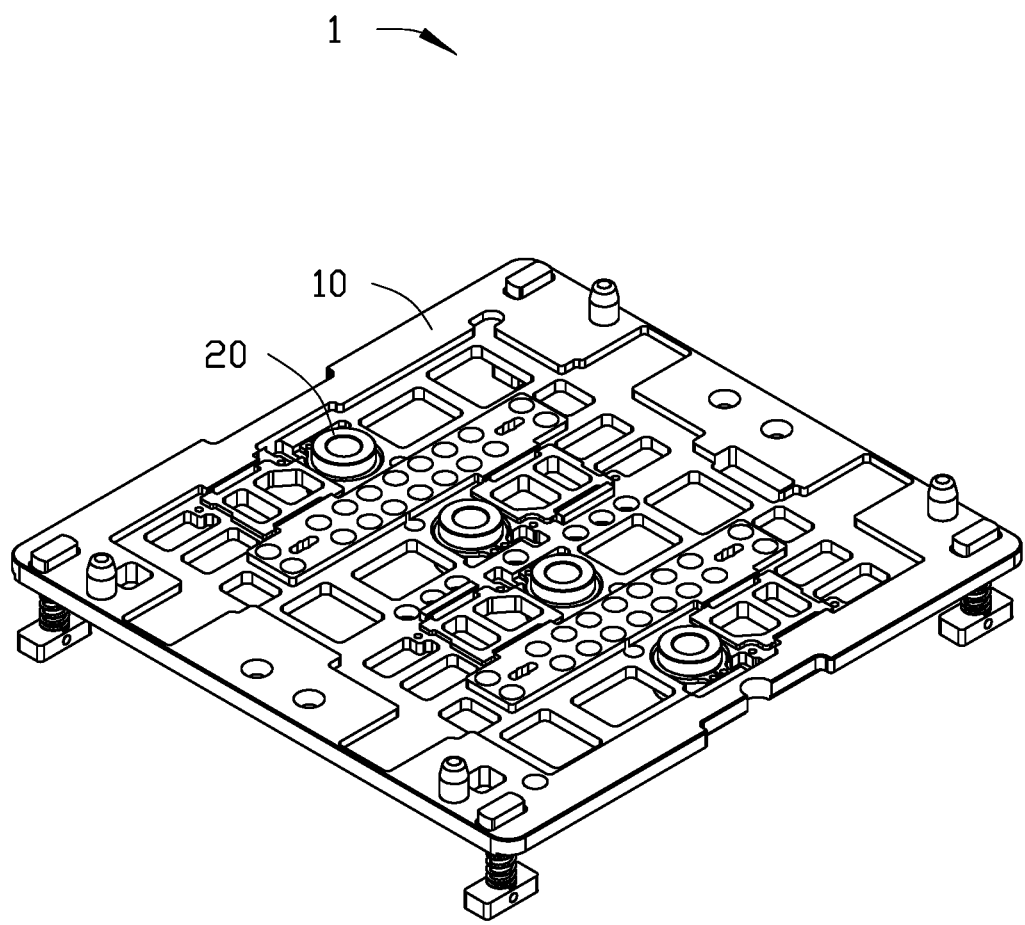
FIG. 1 is a diagrammatic view showing an exemplary embodiment of a clamping device.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

The term "comprising" means "including, but not necessarily limited to"; it specifically indicates open-ended inclusion or membership in a so-described combination, group, series and the like.

Exemplary embodiments of the present disclosure will be described in relation to the accompanying drawings.

FIG. 1 illustrates an exemplary embodiment of a clamping device 1. The clamping device 1 can press a solderable part (not shown) of a circuit board (not shown) onto the circuit board. The clamping device 1 includes a base plate 10, and at least one press block 20. The at least one press block 20 is slidably arranged on the base plate 10, such that the at least one press block 20 can be moved up or down relative to the base plate 10. The at least one press block 20 can exert pressure on the solderable part of the circuit board by its own weight when the at least one press block 20 moves down relative to the base plate 10. In at least one exemplary embodiment, the solderable part is a SIM card.

Figure 2:
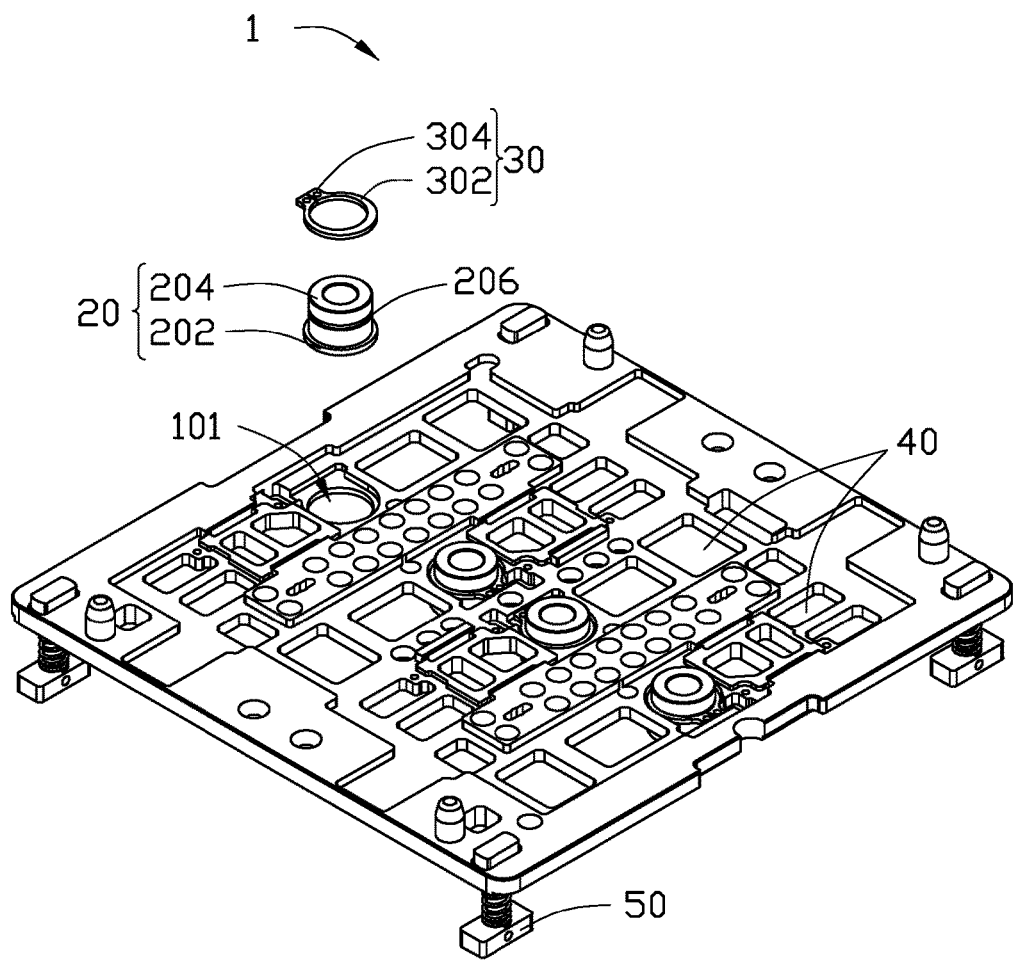
FIG. 2 is an exploded, isometric view of the clamping device of FIG. 1.

FIG. 2 also illustrates the clamping device 1 of FIG. 1. The at least one press block 20 includes a first cylinder block portion 202 and a second cylinder block portion 204. The first cylinder block portion 202 and the second cylinder block portion 204 are coaxial to each other. The radius of the first cylinder block portion 202 is greater than the radius of the second cylinder block portion 204. The height of the first cylinder block portion 202 is less than the height of the second cylinder block portion 204. In at least one exemplary embodiment, the at least one press block 20 is an integrally formed cylindrical block made of copper.

The base plate 10 defines at least one first through hole 101. Each of the at least one first through holes 101 corresponds to one press block 20. The radius of the first through hole 101 is greater than the radius of the second cylinder block portion 204, but less than the radius of the first cylinder block portion 202. The clamping device 1 also includes at least one snap ring 30. Each press block 20 has an associated snap ring 30. An end of the second cylinder block portion 204 of the press block 20 that is away from the first cylinder block portion 202 passes through the bottom side of the first through hole 101 and then the snap ring 30 clips around the periphery of the second cylinder block portion 204, in an annular groove 206 (discussed in more detail below). Accordingly, the snap ring 30 and the first cylinder block portion 202 are on different sides of the base plate 10. When the second cylinder block portion 204 passes through the first through hole 101, the second cylinder block portion 204 is restricted both by the first cylinder block portion 202 and the snap ring 30.

In this exemplary embodiment, the snap ring 30 includes an annular body 302 and two ends 304 connected to the annular body 302. The internal diameter of the annular body 302 is slightly less than the diameter of the second cylinder block portion 204. The external diameter of the annular body 302 is greater than the diameter of the first through hole 101. The annular groove 206 is defined in the second cylinder block portion 204. The internal diameter created by the annular groove 206 matches with that of the snap ring 30 for receiving and retaining the annular body 302 of the snap ring 30. Accordingly, the part of the second cylinder block portion 204 between the first cylinder block portion 202 and the snap ring 30 can freely pass through the first through hole 101 by the self-weighted of the press block 20. In this exemplary embodiment, the distance between the snap ring 30 and the first through hole 101 is greater than a thickness of the part of the base plate 10. The weight of the press block 20 can be between about 9 grams and 9.5 grams. In this exemplary embodiment, the numbers of the press blocks 20, the first through holes 101, and the snap rings 30 are all four.

In this exemplary embodiment, the base plate 10 also defines a number of second through holes 40, some of which may have different sizes from each other. The second through holes 40 are defined around the first through holes 101. When using Surface Mount Technology to solder the circuit board, the press block 20 of the clamping device 1 can be used to press the solderable part of the circuit board.

The soldering heat, which when required, can be transferred to the solderable part by the second through holes 40 around the first through holes 101.

Figure 3:
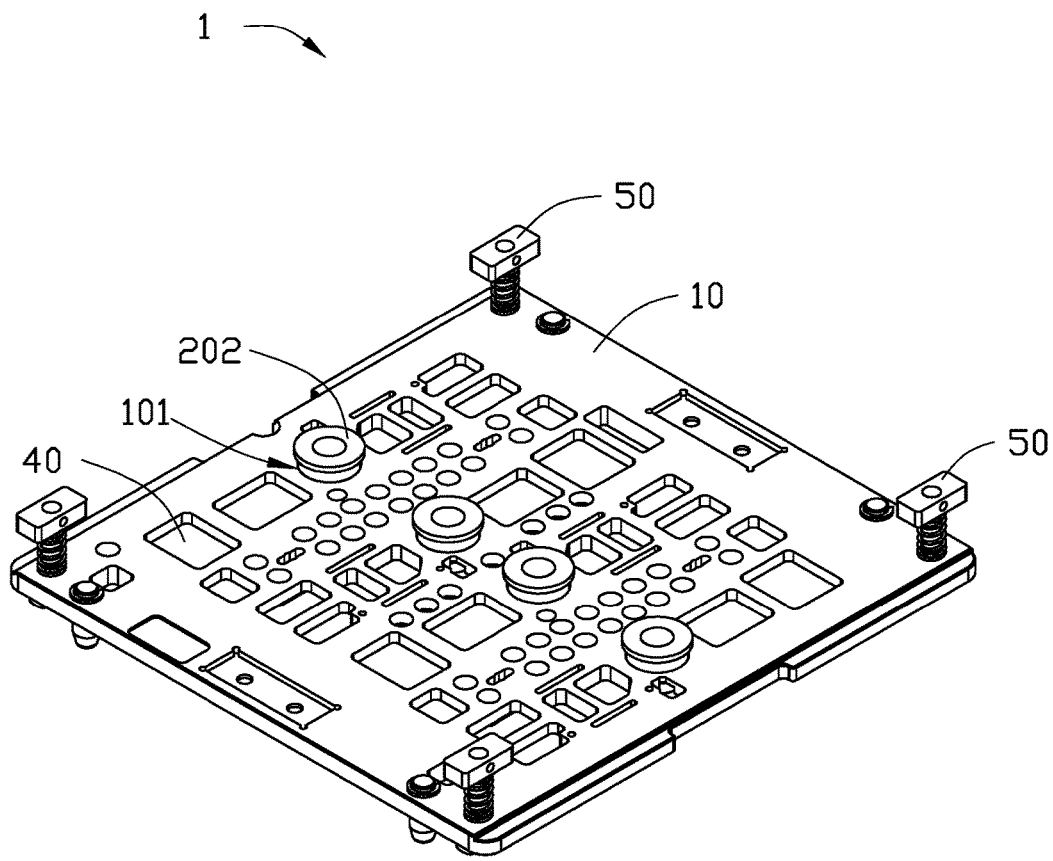
FIG. 3 is another diagrammatic view of the clamping device of FIG. 1.

FIG. 3 illustrates another view of clamping device 1 of FIG. 1. In this exemplary embodiment, the base plate 10 also defines a number of support elements 50. Each support element 50 is arranged substantially adjacent to a corner of the base plate 10. The support elements 50 can support the clamping device 1. The thickness of the support element 50 is less than the distance between the first cylinder block portion 202 and the annular groove 206.

The use of the clamping device 1 is as follows: first, the second cylinder block portion 204 of the press block 20 is pushed to pass up through the bottom of the first through hole 101. Then the annular body 302 of the snap ring 30 is fitted to the annular groove 206 of the second cylinder block portion 204. When the first cylinder block portion 202 of the press block 20 is placed on the a solderable portion of the solderable part by a user, the first cylinder block portion 202 is able to press the solderable part to the circuit board by its own weight.

The exemplary embodiments shown and described above are only examples. Even though numerous characteristics and advantages of the present technology have been set forth in the foregoing description, together with details of the structure and function of the present disclosure, the present disclosure is illustrative only, and changes may be made in the detail, including in matters of shape, size, and arrangement of the parts within the principles of the present disclosure, up to and including, the full extent established by the broad general meaning of the terms used in the claims.

What is claimed is:

1. A clamping device for soldering operations, the clamping device comprising:
   a base plate; and
   at least one press block configured to be arranged on the base plate, wherein the at least one press block is configured to be moved up or down relative to the base plate;
   wherein when the at least one press block moves down relative to the base plate, the weight of the at least one press block exerts pressure on the base plate, wherein the at least one press block comprises a first cylinder block portion and a second cylinder block portion, the base plate defines at least one first through hole, and each of the at least one first through hole corresponds to one press block, wherein the clamping device further comprises at least one snap ring, the second cylinder block portion of the press block comprises two ends positioned opposite each other, each snap ring corresponds to one press block, and one end of the second cylinder block portion of the press block faces away from the first cylinder block portion that passes through to the bottom side of the first through hole, the snap ring clips around the periphery of the second cylinder block portion, whereby the snap ring and the first cylinder block portion are located on different sides of the base plate.

2. The clamping device of claim 1, wherein the first cylinder block portion and the second cylinder block portion are coaxial to each other.

3. The clamping device of claim 2, wherein a radius of the first cylinder block portion is greater than a radius of the second cylinder block portion, and a height of the first cylinder block portion is less than a height of the second cylinder block portion.

4. The clamping device of claim 3, wherein a radius of the first through hole is greater than the radius of the second cylinder block portion but less than the radius of the first cylinder block portion.

5. The clamping device of claim 4, wherein the snap ring comprises an annular body, the internal diameter of the annular body is slightly less than the diameter of the second cylinder block portion, the external diameter of the annular body is greater than the diameter of the first through hole, and the second cylinder block portion defines an annular groove, the annular groove matches with the snap ring for receiving and retaining the annular body of the snap ring.

6. The clamping device of claim 4, wherein the base plate defines a number of second through holes defined around the first through holes.

7. The clamping device of claim 6, wherein some of the second through holes have different sizes from the other second through holes.

8. The clamping device of claim 4, wherein the base plate further defines a number of support elements, each support element is arranged substantially adjacent to a corner of the base plate to support the clamping device.

9. The clamping device of claim 4, wherein the numbers of the press blocks, the first through holes, and the snap rings are respectively four.

10. The clamping device of claim 1, wherein the press block is an integrally formed cylindrical copper block.

11. The clamping device of claim 10, the weight of the press block is between about 9 grams and 9.5 grams.

* * * * *